United States Patent [19]
Kawakami et al.

[11] Patent Number: 5,133,120
[45] Date of Patent: Jul. 28, 1992

[54] METHOD OF FILLING CONDUCTIVE MATERIAL INTO THROUGH HOLES OF PRINTED WIRING BOARD

[75] Inventors: Shin Kawakami; Satoshi Haruyama; Hirotaka Okonogi, all of Saitama, Japan

[73] Assignee: Nippon CMK Corp., Japan

[21] Appl. No.: 670,311

[22] Filed: Mar. 15, 1991

[30] Foreign Application Priority Data

Jul. 11, 1990 [JP] Japan .................. 2-183066

[51] Int. Cl.⁵ .............................................. B23F 19/00
[52] U.S. Cl. ...................................... 29/852; 174/263; 228/33; 427/97
[58] Field of Search ...................... 29/852; 427/96, 97; 228/33; 174/263

[56] References Cited

U.S. PATENT DOCUMENTS

| | | | |
|---|---|---|---|
| 4,478,882 | 10/1984 | Roberto | 427/97 |
| 4,622,239 | 11/1986 | Schoenthaler et al. | 427/96 |
| 4,646,057 | 2/1987 | Reynolds | 29/852 X |
| 4,720,402 | 1/1988 | Wojcik | 427/96 X |
| 4,732,780 | 3/1988 | Mitoff et al. | 29/852 X |
| 4,808,435 | 2/1989 | Cropp et al. | 427/97 |

FOREIGN PATENT DOCUMENTS

| | | | |
|---|---|---|---|
| 1-236694 | 9/1989 | Japan | 427/97 |
| 571353 | 9/1977 | U.S.S.R. | 228/33 |

OTHER PUBLICATIONS

IBM Tech. Disclosure Bulletin, vol. 14, No. 9, Feb. 1972, pp. 2691-2692 by J. A. Lau et al. (29/852).

*Primary Examiner*—Carl J. Arbes
*Attorney, Agent, or Firm*—Bruce L. Adams; Van C. Wilks

[57] ABSTRACT

To achieve the above object, the invention provides a novel method of filling through holes of a printed wiring board with conductive filler material by initially feeding compressed air to the conductive filler material by initially feeding compressed air to the conductive filler material across mask in the direction of through holes so that pressurized conductive filler material can be filled into through holes from a conductive-material extruding nozzle unit.

It is suggested that such silk screen be used for the mask, which is provided with through holes at positions corresponding to the positions of these through holes of the printed wiring board.

It is also suggested that such a nozzle assembly unit be used, which incorporates a conductive-material storing chamber and a nozzle tip member at the tip of this chamber, and yet, a conductive-material supply unit is connected to an operating unit of an extrusion valve in the chamber so that the conductive filler material can be delivered to the tip of the nozzle assembly unit.

It is also suggested that a dolly unit be used at a position corresponding to the mask composed of silk screen.

Furthermore, it is suggested that solvent-free conductive filler material be used.

17 Claims, 3 Drawing Sheets

METHOD OF FILLING CONDUCTIVE MATERIAL INTO THROUGH HOLES OF PRINTED WIRING BOARD

BACKGROUND OF THE INVENTION

1. Field of the Invention

The present invention relates to a method of filling conductive filler material into through holes of a printed wiring board.

2. Description of the Prior Art

Conventionally, in order to fill through holes of a printed wiring board with conductive filler material, this filler material is caused to adhere to the interior of through holes using a number of pins adhered with conductive filler material by inserting these pins externally bearing this material into through holes of a printed wiring board. Alternatively, there is another conventional method which initially prepares a silk screen compatible with the designed circuitry of the printed wiring board in order that the conductive filler material can be filled into through holes of the printed wiring board via the silk screen.

Nevertheless, when applying the former pin insertion method, the amount of conductive filler material adhering to the external surface of these pins is inadequate. According to this conventional method, the processing system requires repeatedly inserting the pins into each through hole for many rounds before eventually filling up each through hole with enough amount of conductive filler material. This is turn involves much inconvenience and poor operating efficiency.

Furthermore, when executing the above operation with a number of pins, the conductive filler material adhered to the interior of through holes must be cured every round. This is turn causes the substrate of the printed wiring board to quickly incur substantial damage caused by thermal effect, thus significantly degrading the dimensional stability of the printed wiring board itself.

Furthermore, if the printed wiring board were provided with a number of through holes, then a large number of pins must be used with every round of operation. Practically, no system can use more than 1,000 pins per round of operation. Since the number of workable pins is limited, there is a critical limit in the size of each printed wiring board. For example, normally, a size of more than 300 square millimeters cannot be obtained.

This is turn involves difficulty in the manufacture of pin jigs arranging pins at positions corresponding to the positions of the through holes of the printed wiring board. Additionally, this process results in poor workability for executing mass production of the printed wiring board.

On the other hand, when applying the latter conventional method based on the silk screening method, squeegee pressure may not evenly be applied to the silk screen. Even when applying normal squeegee pressure, it is still difficult for this conventional method to fully fill up all the through holes of a printed wiring board with the conductive filler material. For example, if the printed wiring board were too thick or the diameter of the through hole were too narrow, then the conductive filler material cannot be filled into these through holes at all. For example, under the technical skill available today, if the printed wiring board were provided with 1.6 mm of thickness, then a diameter of 0.7 mm of each through hole is the minimum critical limit, and thus, if the through hole had a diameter of less than 0.7 mm, then the conductive filler material cannot be filled into this through hole at all.

Furthermore, when applying either of these conventional methods, fluidity of the conductive filler material severely affects the uniformity of the filling effect, and thus, much complexity is present in the practice of any conventional system. Normally, the conventional methods add a solvent to the conductive filler material in order to increase the fluidity of the conductive filler material. However, when curing the conductive filler material filled in the through hole, solvent thermally vaporizes inside the through hole, thus generating bubble and crack as well. This in turn causes the through holes to clog. Once the through hole is clogged, it is difficult to remove residual solvent.

More particularly, it is conventional that high-grade alcoholic solvent having a high boil point is used in order to properly maintain fluidity of the conductive filler material. In order to fully remove vaporized solvent, it is essential for any system to properly adjust temperature and time so that no bubble can be generated. Perfect removal of solvent from the through hole promotes the reliability of the produced printed wiring board. The invention has been achieved to fully solve those defects inherent in the conventional methods of filling conductive filler material. The object of the invention is to provide a novel method of uniformly filling conductive filler material into through holes of a printed wiring board independent of the thickness of printed wiring board, and the number and the diameter of through hole.

SUMMARY OF THE INVENTION

To achieve the above object, the invention provides a novel method of filling through holes of a printed wiring board with conductive filler material by initially pressurizing the conductive filler material and feeding the pressurized conductive filler material through a mask in the direction of the through holes so that the pressurized conductive filler material can be filled into the through holes from a conductive-material extruding nozzle unit.

A silk screen may be used for the mask, which is provided with passage holes at positions corresponding to the positions of these through holes of the printed wiring board.

A nozzle assembly unit may be used, which incorporates a conductive-material storing chamber and a nozzle tip member at the tip of this chamber. Also, a conductive-material supply unit may be connected to an operating unit of an extrusion valve in the chamber so that the conductive filler material can be delivered to the tip of the nozzle assembly unit.

Also, a supporting substrate may be used at a position corresponding to the silk screen mask.

Furthermore, solvent-free conductive filler material may be used.

DETAILED DESCRIPTION OF THE INVENTION

Referring now to the accompanying drawings, embodiments of the invention are described below.

The First Embodiment

Figure 1:
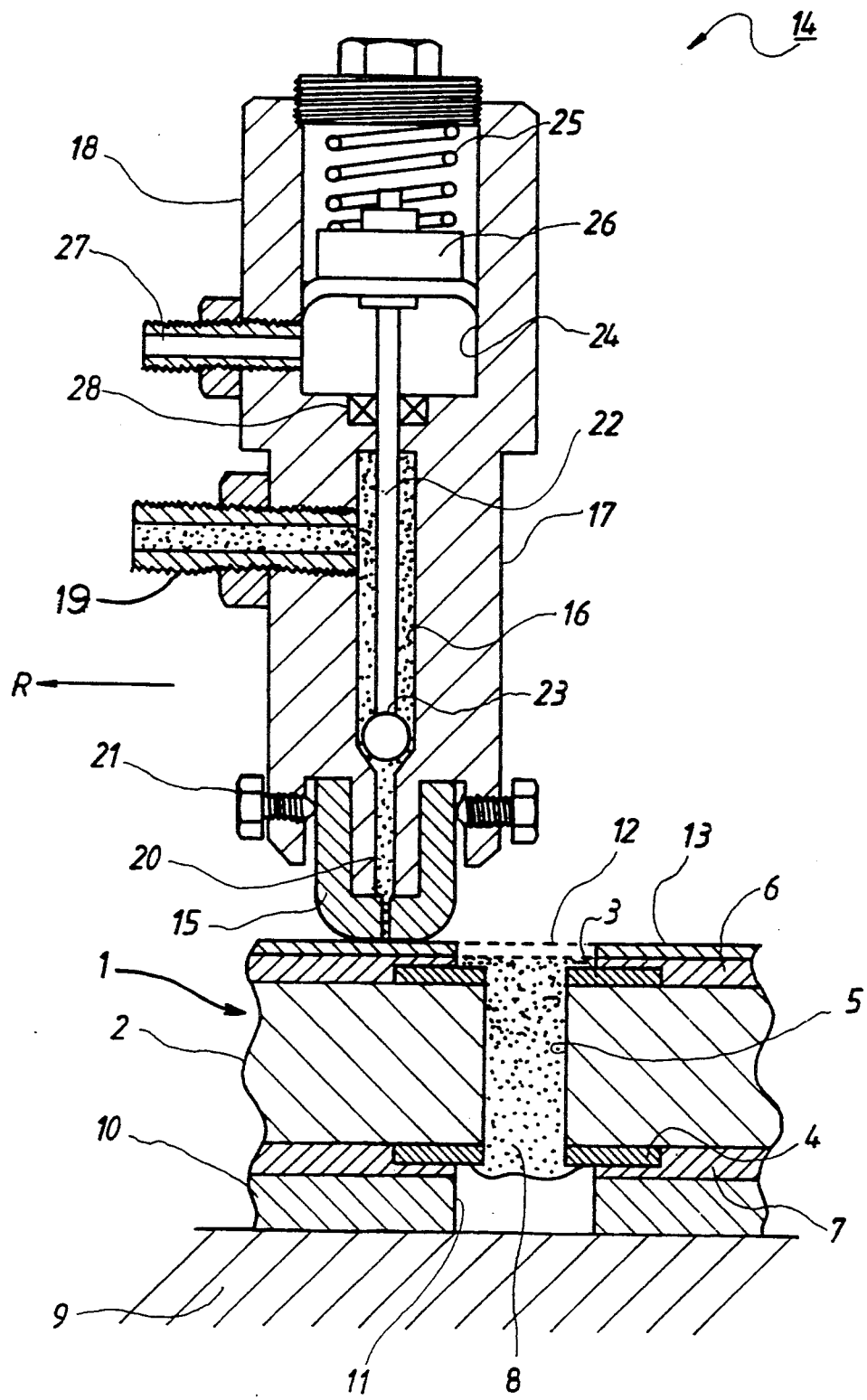
FIGS. 1 through 3 respectively designate the system for filling conductive filler material into through holes of a printed wiring board according to the first, second and third embodiments of the invention.

FIG. 1 designates a sectional view of the system for filling conductive filler material into through hole(s) of the printed wiring board according to the first embodiment of the invention. The reference numeral 1 shown in FIG. 1 designates a printed wiring board. The printed wiring board 1 incorporates a substrate 2 which is composed of an insulative material. Predetermined printed circuits (not shown) are provided on both surfaces of the substrate 2 by applying conductive circuits. Connecting lands 3 and 4 electrically connecting those printed circuits on both surfaces of the substrate 2 are respectively provided inside of these printed circuits. A number of through holes 5 are provided between and across these connecting lands 3 and 4 by applying either a punching (pressing) or drilling process. Under resist (solder resist) films 6 and 7 are coated on the printed circuits provided on both surfaces of the substrate 2.

When filling the conductive filler material 8 into a through hole 5 of the printed wiring board 1, first the printed wiring board 1 is mounted on a supporting substrate 10 secured on a base 9. In this case, as shown in FIG. 1, vent hole 11 of the supporting substrate 10 is provided at a position corresponding to the position of the through hole of the printed wiring board 1.

A mask 13 provided with a perforation a passage hole 12 for allowing passage of the conductive filler material 8 is mounted on the printed wiring board 1 so that the perforated holes 12 are aligned with the through hole 5 of the printed wiring board 1.

Next, the conductive filler material 8 is extruded from the nozzle tip 15 of the nozzle assembly unit 14 which is disposed above the mask 13 and is movable in the horizontal direction. The through hole 5 of the printed wiring board 1 is then filled with the conductive filler material 8 via the perforated hole 12 of the mask 13.

The nozzle assembly unit 14 used for filling the conductive filler material 8 into the through hole 5 is composed of a nozzle body 17 incorporating a chamber 16 for transporting the conductive filler material 8 and an operating mechanism 18 which operates a conductive-material extruding valve 23 stored in the chamber 16 of the nozzle body 17.

The conductive filler material 8 is supplied to the chamber 16 from a conductive-material supply source (not shown) via a conductive-material inlet 19. The nozzle tip member 15 is removably fixed to a conductive-material extruding hole 20 of the chamber 16 by means of a screw 21. The conductive-material extruding valve 23 is secured to the conductive-material extruding hole 20 of the chamber 16 via an operating rod 22 whose tip is connected to an operating valve 26 which is biased by a spring 25 stored in the mechanical chamber 24.

A pneumatic source (not shown) is connected to the mechanical chamber 24 of the operating mechanism 18 via a connector 27 and a controller unit (not shown). The reference numeral 28 designates a slide bearing unit of the operating rod 22.

Next, functional operation of the system according to the first embodiment is described below.

When filling the conductive filler material 8 into the through hole 5 via the mask 13 by operating the nozzle assembly unit 14, first, the tip member 15 of the nozzle assembly unit 14 is brought into contact with the top surface of the mask 13, and then moved in the horizontal direction.

While the tip member 15 of the nozzle assembly unit 14 horizontally moves, the tip member 15 scans the position of the through hole 5 of the printed wiring board 1, and then, as soon as the tip member 15 arrives at the position right above the through hole 5, the operating rod 22 of the operating unit 18 is lifted in resistance against the biasing force of the spring 26 in order to open the conductive-material extruding valve 23 and the extruding hole 20. Simultaneously, the conductive filler material 8 supplied from the inlet 19 to the interior of the conductive-material transporting chamber 16 via the pneumatic pressure supply source is then extruded from the tip member 15 of the nozzle assembly unit 14, and then the conductive filler material 8 is pneumatically filled into the through hole 5 via the fine through hole perforation 12 of the mask 13.

After pneumatically being filled into the through hole 5, the conductive filler material 8 is led to the bottom of the substrate 2. In other words, the conductive filler material 8 is exposed to the open space of the vent hole 11 of the supporting substrate 10, and as a result, the exposed part of the conductive filler material 8 remains in perfect union with the connecting land 4 at the bottom level of the substrate 2, thus effectively preventing the occurrence of a faulty electrical connection.

It is desired that the open space of the vent valve 11 of the supporting substrate 10 be arranged to be slightly wider than the diameter of the through hole 8.

Basically, the mask 13 is composed of a silk screen having a mesh of 180 through 300 for example. Alternatively, the invention can also be embodied by applying such a mask capable of inhibiting outflow of the conductive filler material 8 from the nozzle tip member 15 outside of the position corresponding to the through hole 5.

In regard to FIG. 1, the above description has solely referred to a single case of filling the through hole 5 of the printed wiring board 1 with conductive filler material 8. It should be understood however that the conductive filler material 8 can continuously be filled into a plurality of through holes 5 by applying the identical method thus far described.

Next, a typical condition for filling the conductive filler material 8 using the above nozzle assembly unit 14 is shown below. The condition is numerically specified for the scanning operation using the nozzle assembly unit 14.

| | |
|---|---|
| Scan speed | 100 mm per second |
| Thickness of the printed wiring board | 1.6 mm |
| Diameter of through hole | 0.4 mm |
| Pneumatic pressure applied to injection | 6.0 g/cm$^2$ |
| Viscosity of conductive filler material | 1,000 cps/25° C. |

Note the conductive material is made from copper paste which is free of solvent.

After filling up the through hole 5 with the above conductive filler material made from copper paste, as described above, the conductive filler material 8 inside of the through hole 5 was treated with a curing process at 150° C. for 30 minutes by means of an oven heater before a through circuit was eventually formed in the through hole 5.

The Second Embodiment

Figure 2:
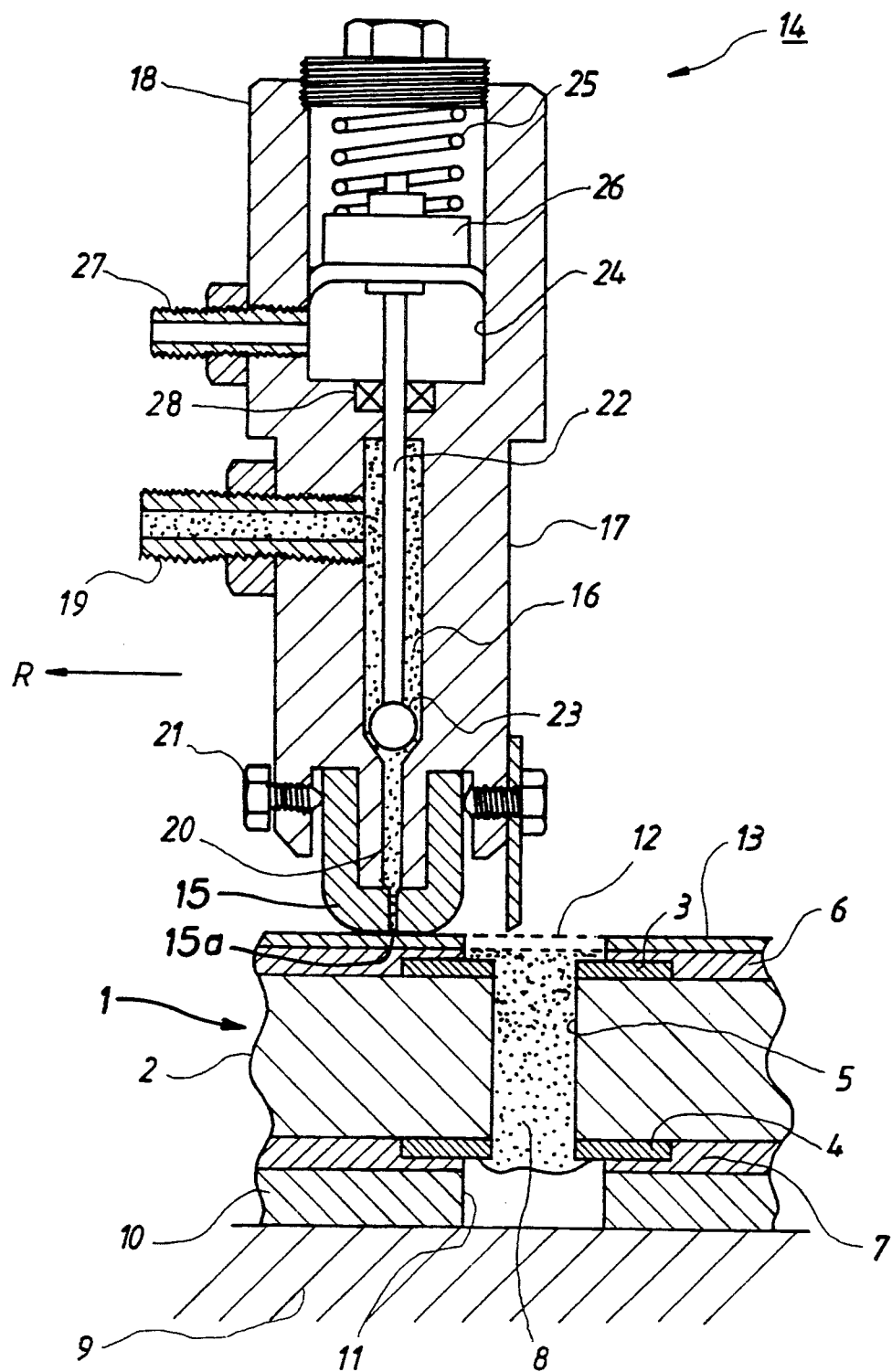

FIG. 2 designates the second embodiment of the invention. The second embodiment introduces a nozzle assembly unit having the structure which is slightly different from the first embodiment. Except for this, other components of the second embodiment are identical to those of the first embodiment, and thus, all the identical components are designated by the identical reference numerals. Accordingly, description of these is deleted here.

In the second embodiment shown in FIG. 2, a blade member squeegee unit 29 is installed to one-side of the tip member 15 of the nozzle assembly unit 14 with a screw 21'. The squeegee unit 29 is secured to the position behind the moving direction of the tip member 15 of the nozzle assembly unit 4 which also moves in the horizontal direction.

After filling up the through hole 5 with the conductive filler material 8 by means of the nozzle assembly unit, relative to the horizontal movement of the nozzle assembly unit 14, the squeegee unit 29 secured to the tip member 15 of the nozzle assembly unit 14 wipes off the superficially exposed conductive filler material 8 from the top edge of the through hole 5 along the fine through holes of the mask 13.

The nozzle tip member 15 can be replaced by a removing screw 21 of 20' in order that the diameter of the conductive-material extruding hole 15a can selectively be replaced. Furthermore, taking the wear resistance of the extruding hole 15a coming into contact with the mask 13 and protection of the mask 13 into consideration, it is desired that the extruding hole 15a be made from either plastic or synthetic rubber. Likewise, it is also desired that material for composing the squeegee unit 29 be selected with utmost care.

The Third Embodiment

Figure 3:
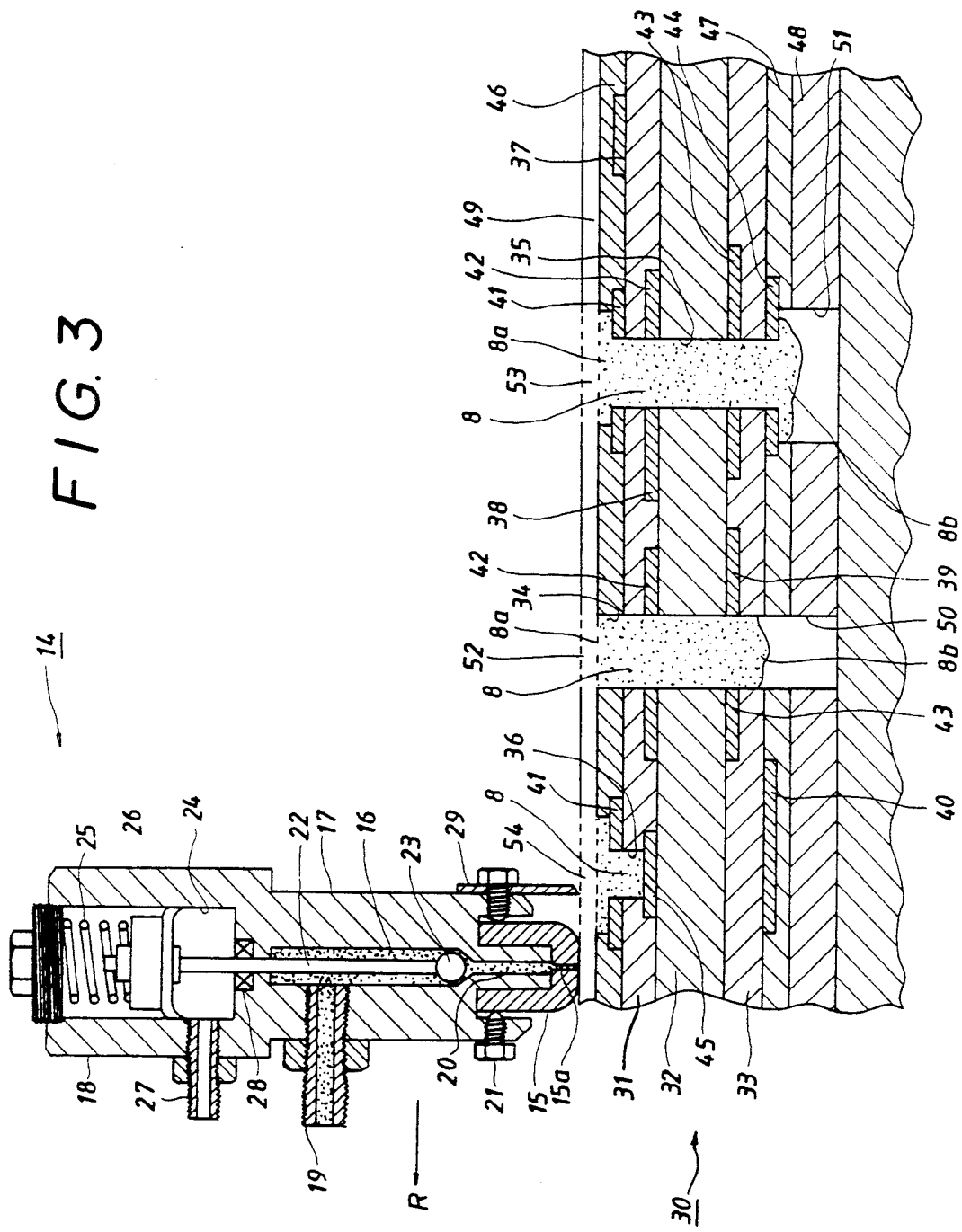

FIG. 3 designates the third embodiment of the invention. Unlike the first embodiment in which the conductive filler material is filled in the through hole 5 of the printed wiring board 1 provided with printed circuits on both surfaces, the third embodiment executes the method of filling the conductive filler material 8 into through holes 34 and 35 and a connecting hole 36 which are respectively provided in a multi-stratified printed wiring board 30 composed of triple substrates 31 through 33.

A plurality of printed circuits 37 through 40 are respectively secured to both surfaces of the triple substrates 31 through 33 of the printed wiring board 30. Connecting lands 41 through 44 are respectively provided inside of these printed circuits 37 through 40 of the triple substrates 31 through 33 so that these printed circuits 37 through 40 in the triple substrates 31 through 33 can be connected to each other. Those through holes 34 and 35 electrically connect between those connecting lands 42 and 43 of the triple substrates 31 through 33 and those connecting lands 41 through 44, respectively. Of those printed circuits of the substrate 31, the connecting hole 36 electrically connects between the connecting land 41 of the front-surface printed circuit 37 and a connecting circuit 45 of the back-surface printed circuit 38.

Solder resist films 46 and 47 are coated on the top substrate 31 and the bottom substrate 33 of the printed wiring board 30 to fully cover the printed circuits 37 and 40.

The through holes 34 and 35 are provided by executing either a punching process or a drilling process. The connecting hole 36 is also provided by executing a drilling process.

When filling the conductive filler material 8 into those through holes 34 and 35 and the connecting hole 36 of the printed wiring board 30 having the structure mentioned above, as was done for the first embodiment, a supporting substrate 48 is mounted on a base 9, and then the printed wiring board 30 is mounted on the supporting substrate 48. Then, mask 49 is placed on the printed wiring board 30. Then, as was done for the first embodiment, the nozzle assembly unit 14 is horizontally driven in the direction of the connecting hole 36 from the through hole position before eventually filling the conductive filler material 8 into those through holes 34 and 35 and the connecting hole 36.

The support substrate 48 and the mask 49 are respectively provided with vent holes 50 and 51 and conductive-material passing holes 52 through 54 at those positions corresponding to the positions of those through holes 34 and 35 and the connecting hole 36. When the supporting substrate 48 and the mask 49 are respectively set in the predetermined positions, the vent holes 50 and 51 and the conductive-material passing holes 52 through 54 are respectively aligned with the through holes 34 and 35 and the connecting hole 36.

Like the second embodiment, a squeegee unit 29 is secured to the nozzle assembly unit 14. By virtue of this provision, after filling up those through holes 34 and 35 and the connecting hole 36 with the conductive filler material 8, excessive conductive filler material 8a exposed on the level surface is wiped off from the level surface along those fine holes 52 through 54 of the mask 49 relative to the movement of the squeegee unit 29 while continuously following up the operation for filling the conductive filler material 8 into those through holes 34 and 35.

The above embodiments have respectively executed the operation for filling the conductive filler material 8 into through holes of the printed wiring board. However, the system embodied by the invention can also be applied to the case of filling other material like the one which is available for clogging holes for example.

According to the first, second, and the third embodiments of the invention, by effectively applying operation of the conductive-material filling nozzle assembly unit 14, the conductive filler material 8 is pneumatically filled into those through holes 5, 34 and 35, or into the connecting hole 36 through the conductive-material passing fine holes 12, 52, 53 and 54 of the mask 13 or the mask 49. In consequence, irrespective of the fluidity of conductive filler material and the thickness of the substrate, the conductive filler material can smoothly be filled into those through holes having minimal diameter by properly adjusting and controlling the injecting condition, thus significantly promoting an increase in the density of electronic circuits.

Furthermore, since the through holes can be filled completely with the conductive filler material independent of the fluidity of the conductive filler material, the system embodied by the invention dispenses with the addition of solvent otherwise needed for ensuring proper fluidity of the conductive filler material. As a result, the system embodied by the invention can effectively prevent the occurrence of potential defects caused by the addition of solvent. In other words, the object for filling the conductive filler material free of solvent has been achieved by pneumatically injecting it into through holes of the printed wiring board by applying the material injecting nozzle system.

The nozzle tip member 15 of the nozzle assembly unit 14 is replaceable as required, and thus, the conductive filler material can evenly and stably be filled into through holes in correspondence with the condition of the extrusion of conductive filler material from the nozzle unit, diameter of through hole, and the thickness of the printed wiring board.

Furthermore, since the conductive filler material is filled into through holes via a mask, the system embodied by the invention can prevent the conductive filler material from adhesion to unwanted regions.

Furthermore, the system embodied by the invention can continuously fill the conductive filler material into the predetermined through holes corresponding to those circuits designed for the printed wiring board, and thus, the system embodied by the invention promotes efficiency of the operation for filling the conductive filler material into the specified through holes.

As is clear from the above description, according to the system embodied by the invention, conductive filler material can evenly and stably be filled into the predetermined through holes independent of the thickness of the printed wiring board, diameter of the through holes, or the fluidity of the conductive filler material itself.

What is claimed is:

1. A method of filling holes in a printed wiring board with conductive filler material, comprising the steps of:
   providing a printed wiring board having at least one through-hole;
   providing a mask having a through-hole;
   positioning the mask relative to the printed wiring board to align the mask through-hole with the printed wiring board through-hole;
   providing a nozzle connected to a source of flowable pressurized conductive filler material; and
   scanning the nozzle relative to the mask to align the nozzle with the aligned through-holes and then feeding the pressurized conductive filler material from the nozzle through the mask through-hole into the printed wiring board through-hole to fill the latter with pressurized conductive filler material.

2. A method according to claim 1; including supporting the printed wiring board on a substrate having a vent hole, the vent hole being aligned with the printed wiring board through-hole to define a vent space for air displaced during the filling of the conductive filler material in the printed wiring board through-hole.

3. A method according to claim 2; including trailing a blade member behind the nozzle during scanning of the nozzle to remove excess conductive filler material.

4. A method according to claim 3 wherein the feeding of the pressurized conductive filler material is carried out by valving the flow of the conductive filler material through the nozzle.

5. A method according to claim 4 wherein the valving step comprises pneumatically controlling the operation of a valve to control the flow of conductive filler material through the nozzle.

6. A method according to claim 1; wherein the feeding of the pressurized conductive filler material is carried out by valving the flow of the conductive filler material through the nozzle.

7. A method according to claim 6; wherein the valving step comprises pneumatically controlling the operation of a valve to control the flow of conductive filler material through the nozzle.

8. A method according to claim 1; including trailing a blade member behind the nozzle during scanning of the nozzle to remove excess conductive filler material.

9. A claim according to claim 1 wherein the mask comprises a silk-screen.

10. A method according to claim 1 wherein the conductive filler material comprises a solvent-free conductive filler material.

11. A claim according to claim 1 wherein the printed wiring board has electrically conductive lands on opposite sides thereof adjacent to the printed wiring board through-hole; and wherein the filling of the conductive filler material in the printed wiring board through-hole effects electrical connection between the lands through the conductive filler material.

12. A method according to claim 1 wherein the printed wiring board has an electrically conductive member closing the bottom of the printed wiring board through-hole.

13. A method according to claim 1 wherein the printed wiring board and mask have a plurality of aligned through-holes; and the scanning and feeding steps are carried out to sequentially fill the printed wiring board through-holes with conductive filler material.

14. A method according to claim 13 including trailing a blade member behind the nozzle during scanning of the nozzle to remove excess conductive filler material.

15. A method according to claim 14 wherein the feeding of the pressurized conductive filler material is carried out by valving the flow of the conductive filler material through the nozzle.

16. A method according to claim 15 wherein the valving step comprises pneumatically controlling the operation of a valve to control the flow of conductive filler material through the nozzle.

17. A method according to claim 13 wherein the conductive filler material comprises a solvent-free conductive filler material.

* * * * *